(12) United States Patent
Azumo et al.

(10) Patent No.: US 9,293,543 B2
(45) Date of Patent: Mar. 22, 2016

(54) FILM FORMING METHOD AND FILM FORMING APPARATUS

(71) Applicants: TOKYO ELECTRON LIMITED, Tokyo (JP); OSAKA UNIVERSITY, Osaka (JP)

(72) Inventors: Shuji Azumo, Ibaraki (JP); Yusaku Kashiwagi, Ibaraki (JP); Yuichiro Morozumi, Tokyo (JP); Yu Wamura, Iwate (JP); Katsushige Harada, Yamanashi (JP); Kosuke Takahashi, Iwate (JP); Heiji Watanabe, Osaka (JP); Takayoshi Shimura, Osaka (JP); Takuji Hosoi, Osaka (JP)

(73) Assignees: TOKYO ELECTRON LIMITED, Tokyo (JP); OSAKA UNIVERSITY, Osaka (JP)

( * ) Notice: Subject to any disclaimer, the term of this patent is extended or adjusted under 35 U.S.C. 154(b) by 227 days.

(21) Appl. No.: 14/044,119

(22) Filed: Oct. 2, 2013

(65) Prior Publication Data

US 2014/0094027 A1 Apr. 3, 2014

(30) Foreign Application Priority Data

Oct. 3, 2012 (JP) ................................. 2012-221662

(51) Int. Cl.
*H01L 21/283* (2006.01)
*H01L 21/441* (2006.01)
(Continued)

(52) U.S. Cl.
CPC ............ *H01L 29/401* (2013.01); *C23C 16/303* (2013.01); *C23C 16/308* (2013.01); *H01L 21/022* (2013.01); *H01L 21/0228* (2013.01); *H01L 21/02178* (2013.01); *H01L 21/02252* (2013.01); *H01L 21/02271* (2013.01); *H01L 21/02326* (2013.01); *H01L 21/02332* (2013.01); *H01L 21/044* (2013.01); *H01L 21/049* (2013.01); *H01L 21/28264* (2013.01); *H01L 29/513* (2013.01); *H01L 29/517* (2013.01); *H01L 29/518* (2013.01); *H01L 29/66045* (2013.01); *H01L 29/66068* (2013.01); *H01L 29/66712* (2013.01); *H01L 29/66734* (2013.01);
(Continued)

(58) Field of Classification Search
None
See application file for complete search history.

(56) References Cited

U.S. PATENT DOCUMENTS

| 7,304,331 B2 * | 12/2007 | Saito .................... H01L 29/1066 257/187 |
| 2002/0090773 A1 * | 7/2002 | Bojarczuk, Jr. ... H01L 21/28202 438/197 |
| 2006/0011915 A1 * | 1/2006 | Saito .................... H01L 29/1066 257/65 |

OTHER PUBLICATIONS

Fujitsu Laboratories Ltd., "Development of Defect Control Technology of High Dielectric Constant Gate that Realizes High-Speed Transistor," press release 2002-0164, Jul. 1, 2002 (8 pages).

(Continued)

*Primary Examiner* — Zandra Smith
*Assistant Examiner* — Molly Reida
(74) *Attorney, Agent, or Firm* — Rothwell, Figg, Ernst & Manbeck, P.C.

(57) ABSTRACT

Provided is a method of forming a gate insulating film for use in a MOSFET for a power device. An AlN film is formed on a SiC substrate of a wafer W and then the formation of an AlO film and the formation of an AlN film on the formed AlO film are repeated, thereby forming an AlON film having a laminated structure in which AlO films and AlN films are alternately laminated. A heat treatment is performed on the AlON film having the laminated structure.

19 Claims, 10 Drawing Sheets

(51) Int. Cl.
*H01L 29/51* (2006.01)
*H01L 29/40* (2006.01)
*H01L 21/04* (2006.01)
*H01L 21/28* (2006.01)
*H01L 21/02* (2006.01)
*C23C 16/30* (2006.01)
*H01L 29/66* (2006.01)
*H01L 29/78* (2006.01)
*H01L 29/16* (2006.01)
*H01L 29/20* (2006.01)

(52) U.S. Cl.
CPC ........ *H01L 29/7802* (2013.01); *H01L 29/7813* (2013.01); *H01L 29/1602* (2013.01); *H01L 29/1608* (2013.01); *H01L 29/2003* (2013.01)

(56) References Cited

OTHER PUBLICATIONS

K. Manabe, et al., "Suppression of Charges in Al2O3 Gate Dielectric and Improvement of MOSFET Performance by Plasma Nitridation," IEICE Trans. Electron., vol. E87-C, No. 1, Jan. 2004, pp. 30-36 (7 pages).

* cited by examiner

US 9,293,543 B2

FILM FORMING METHOD AND FILM FORMING APPARATUS

CROSS-REFERENCE TO RELATED APPLICATIONS

This application is based on and claims priority from Japanese Patent Application No. 2012-221662, filed on Oct. 3, 2012, with the Japan Patent Office, the disclosure of which is incorporated herein in its entirety by reference.

TECHNICAL FIELD

The present disclosure relates to a film forming method and a film forming apparatus that form an aluminum oxynitride (AlON) film for use in a MOSEFT (Metal Oxide Semiconductor Field Effect Transistor) as a gate insulating film.

BACKGROUND

A substrate formed of, for example, silicon carbide (SiC), gallium nitride (GaN) and diamond has recently been considered to be used in a power MOSFET device because this type of substrate is advantageous over silicon (Si) in terms of thermal conductivity, dielectric breakdown electric field strength, and electron saturation rate, enabling a high temperature operation of an element. As for a method of forming a gate insulating film of the power MOSFET device, it has been proposed to deposit a material capable of forming an insulating film on a substrate using a deposition method. As for the material to be deposited, a high-dielectric material is considered to be desirable and in particular, alumina ($Al_2O_3$) is attracting attention considering the physical property value such as, for example, a band gap.

Since $Al_2O_3$ has a plurality of electron traps, however, when the gate insulating film is formed of $Al_2O_3$ alone, a flat band voltage is shifted, thereby making a threshold voltage unstable. Thus, it has been proposed to eliminate the electron traps by adding nitrogen having valence electrons of which the number is intermediate between the number of valence electrons of the oxygen in the insulating film and the number of valence electrons of the silicon in the substrate. See, e.g., "*Development of Defect Control Technology of High Dielectric Constant Gate That Realizes High-speed Transistor*" released to the press by Fujitsu Laboratories (searched on Jul. 2, 2012) through online [Internet (URL:http://pr.fujitsu.com/jp/news/2002/07/1.html)]. In addition, when adding nitrogen by several at % to $Al_2O_3$ that forms a gate insulating film, a method of producing an AlON film by nitriding $Al_2O_3$ by plasma is used. See, e.g., "K. Manabe, *IEICE TRANS. ELECTRON*, Vol. E87-C, No. 1, page 30, 2004".

SUMMARY

A film forming method according to the present disclosure is a method of forming a gate insulating film for use in a MOSFET for a power device. The film forming method includes forming an AlN film, forming an AlO film, and alternately and repeatedly performing the formation of the AlN film and the formation of the AlO film, thereby forming an AlON film having a laminated structure in which AlO films and AlN films are alternately laminated.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
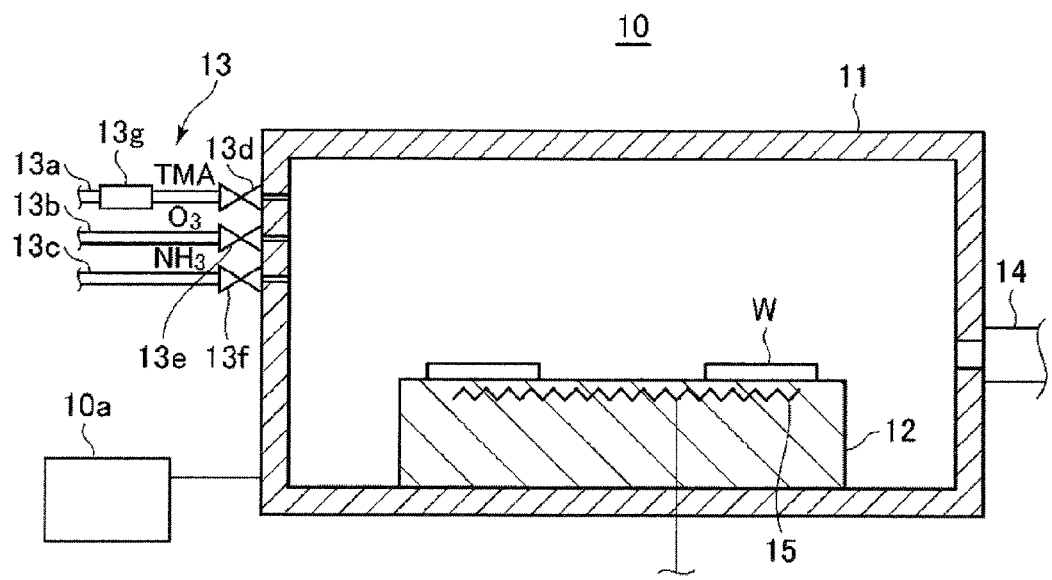
FIG. 1 is a cross-sectional view schematically illustrating a configuration of a film forming apparatus that performs a film forming method according to a first exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

The thickness of a gate insulating film in a conventional MOSFET using a silicon substrate is several nm. Therefore, when an $Al_2O_3$ film which is a gate insulating film is nitrided by plasma, nitrogen may be sufficiently doped in the film thickness direction of the $Al_2O_3$ film so that an AlON film in which nitrogen is uniformly diffused may be produced.

Since a gate insulting film in a power MOSFET has a thickness of at least 50 nm, preferably 100 nm in consideration of pressure-resistance, however, nitrogen is not sufficiently doped in the film thickness direction of the $Al_2O_3$ film which is the gate insulating film when nitridation is attempted by plasma. As a result, an AlON film in which nitrogen is uniformly diffused in the thickness direction may not be produced. When the AlON film in which nitrogen is not uniformly diffused is also used as the gate insulating film, a desired flat band voltage or a threshold voltage may not be achieved.

The present disclosure is to provide a film forming method and a film forming apparatus capable of obtaining an AlON film as an insulating film which has a suitably controlled nitrogen density and is pressure-resistant.

A method of forming a gate insulating film for use in a MOSFET for a power device according to an aspect of the present disclosure includes: forming an AlN film; forming an AlO film; and repeating the formation of the AlN film and the formation of the AlO film, thereby forming an AlON film having a laminated structure in which AlO films and AlN films are alternately laminated.

In the film forming method, the film thickness of the AlON film is 50 nm or more, and the AlON film is formed on a substrate which includes any one of silicon carbonate, gallium nitride, and diamond.

In the film forming method, a heat treatment is performed on the AlON film having the laminated structure. In addition, the AlN film formed at the very first among the AlN films is formed before the AlO film formed at the very first among the AlO films. Further, the formation of AlN film and/or the formation of AlO film are performed by ALD, CVD or PVD.

A method of forming a gate insulating film for use in a MOSFET for a power device according to another aspect of the present disclosure includes: forming an AlN film; oxidizing the AlN film after the AlN film is formed; and repeating the formation of the AlN film and the oxidation of the AlN film alternately, thereby forming an AlON film having a laminated structure in which oxidized AlN films are laminated.

In the film forming method, the film thickness of the AlON film is 50 nm or more, and the AlON film is formed on a substrate which includes any one of silicon carbonate, gallium nitride, and diamond.

In the film forming method, a heat treatment is performed on the AlON film having the laminated structure. In addition, the formation of AlN film is performed by ALD, CVD or PVD.

A film forming method of forming a gate insulating film for use in a MOSFET for a power device according to another aspect of the present invention includes: forming an AlO film; nitriding the AlO film after the AlO film is formed; and repeating the formation of the AlO film and the nitridation of the AlO film alternately, thereby forming an AlON film having a laminated structure in which nitrided AlO films are laminated.

In the film forming method, the film thickness of the AlON film is 50 nm or more, and the AlON film is formed on a substrate which includes any one of silicon carbonate, gallium nitride, and diamond.

In the film forming method, a heat treatment is performed on the AlON film having the laminated structure. In addition, the formation of AON film is performed by ALD, CVD or PVD.

A film forming apparatus according to still another aspect disclosure includes: a film forming unit configured to form an AlN film and an AlO film. The film forming unit repeats the formation of AlN film and the formation of AlO film, thereby forming an AlON film having a laminated structure in which AlO films and AlN films are alternately laminated.

A film forming apparatus according to still another aspect of the present disclosure includes: a film forming unit configured to form an AlN film; and an oxidation unit configured to oxidize the AlN film after the AlN film is formed. The film forming unit and the oxidation unit repeat the formation of the AlN film and the oxidation of the AlN film alternately, thereby forming an AlON film having a laminated structure in which oxidized AlN films are laminated.

A film forming apparatus according to yet another aspect of the present disclosure includes: a film forming unit configured to form an AlO film; and a nitridation unit configured to nitride the AlO film after the AlO film is formed. The film forming unit and the nitridation unit repeat the formation of AlO film and the nitridation of the AlO film, thereby forming an AlON film having a laminated structure in which nitrided AlO films are laminated.

According to the present disclosure, an AlON film as an insulating film which has a suitably controlled nitrogen density and is pressure-resistant may be obtained.

Hereinafter, exemplary embodiments of the present disclosure will be described with reference to accompanying drawings.

First, the film forming method according to the first exemplary embodiment of the present disclosure will be described.

FIG. 1 is a cross-sectional view schematically illustrating a configuration of a film forming apparatus that performs the film forming method according to the first exemplary embodiment of the present disclosure. The film forming apparatus forms an AlON film as a gate insulating film on a semiconductor wafer ("wafer") as a substrate.

Referring to FIG. 1, the film forming apparatus 10 includes a chamber 11 having, for example, a cylindrical shape, a placing table 12 disposed on the bottom portion within the chamber 11, a gas introduction section 13 configured to introduce a processing gas into the chamber 11, an exhausting section 14 configured to exhaust the inside of the chamber 11, and a gate (not illustrated) configured to allow the inside and outside of the chamber 11 to communicate with each other.

The inside of the chamber 11 is isolated from the external atmosphere when a film forming process using ALD (Atomic Layer Deposition) is performed for wafers W in a semi-batch method within the chamber 11. The ALD will be described later. The placing table 12 has a heater 15 incorporated therein and a plurality of wafers W are placed on the placing table 12. The plurality of wafers W placed on the placing table 12 are heated simultaneously. In addition, the placing table 12 may be equipped with a chiller to cool the plurality of wafers W placed thereon and the plurality of wafers W may be placed in a single wafer processing type.

The gas introduction section 13 is configured by three gas introduction tubes 13a, 13a, 13c in which the gas introduction tube 13a introduces an aluminum source such as, for example, TMA (trimethylaluminum), the gas introduction tube 13b introduces an oxygen source such as, for example, ozone ($O_3$), and the gas introduction tube 13c introduces a nitrogen source such as, for example, ammonia ($NH_3$). The operation of each of the constituent elements of the film forming apparatus 10 is controlled by a controller 10a.

The film forming apparatus 10 forms an AlO film (e.g., $Al_2O_3$ film) or an AlN film on a wafer W by ALD. For example, when forming an $Al_2O_3$ film, TMA is introduced from the gas introduction tube 13a first so as to cause respective TMA molecules to be physically adsorbed to the film formed on a surface of the wafer W or the wafer W, and excess TMA molecules (the TMA molecules which are not adsorbed to, for example, the wafer W) are discharged to the outside of the chamber 11 by the exhausting section 14, thereby forming a TMA molecule layer in which a plurality of molecules do not overlap in the thickness direction (i.e., a single layer). Then, $O_3$ is introduced from the gas introduction tube 13b and the wafer W is heated by the heater 15 so as to cause $O_3$ to chemically react with the TMA molecule layer, thereby producing an $Al_2O_3$ film while discharging the excess $O_3$ or a by-product to the outside of the chamber 11. In addition, for example, when forming an AlN film, TMA is introduced from the gas introduction tube 13a first so as to cause respective TMA molecules to be physically adsorbed and the excess TMA molecules are discharged to the outside of the chamber 11 by the exhausting section 14, thereby forming one TMA molecule layer. Then, $NH_3$ is introduced from the gas introduction tube 13c and furthermore, the wafer W is heated so as to cause $NH_3$ to chemically react with the TMA molecule layer, thereby producing an AlN film while discharging the excess $NH_3$ or a by-product to the outside of the chamber 11. That is, the film forming apparatus 10 may form an $Al_2O_3$ film or an AlN film. Meanwhile, the discharge of excess gas (e.g., $O_3$ or $NH_3$) or the by-product may also be performed by purging an inert gas such as, for example, $N_2$ into the chamber 11.

In addition, in order to obtain a film of a high quality by suppressing crystal defects, it is required to manage a dew point of TMA and, for example, the gas introduction tube 13a is provided with a purifier 13g configured to remove moisture. Further, in order to quickly switch processing gasses as being introduced for the purpose of enhancing throughput, the gas introduction tubes 13a, 13b, 13c are provided with valves 13d, 13e, 13f, respectively, which are disposed adjacent to the chamber 11. Thus, the volume from the inside of the chamber 11 to each of the valves 13d, 13e, 13f is reduced as much as possible so that, for example, when the processing gases are switched from TMA to $O_3$, the amount of TMA remaining between the inside of the chamber 11 and the valve 13d may be reduced as much as possible. Consequently, the switching of processing gases may be quickly performed.

Figure 2:
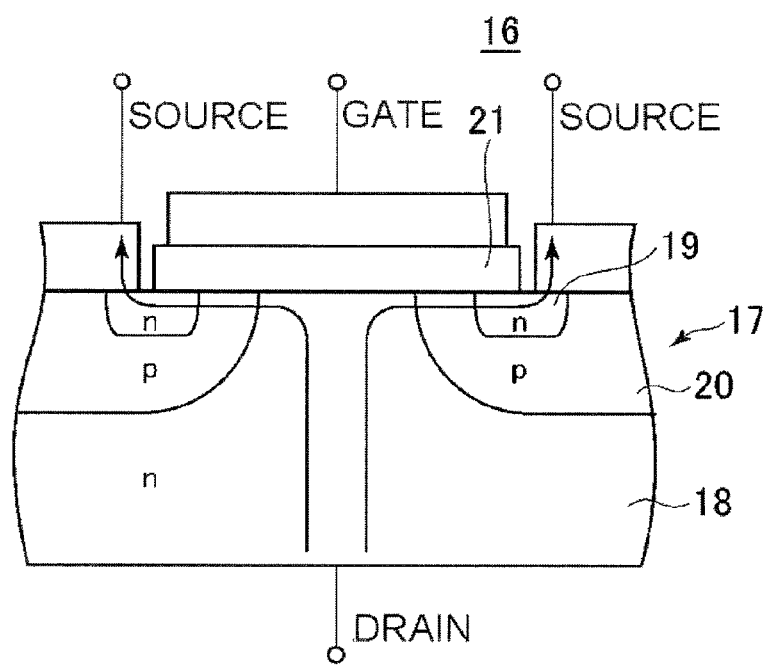
FIG. 2 is a cross-sectional view schematically illustrating a configuration of a MOSFET which has a planar structure and uses an AlON film formed by the first exemplary embodiment as a gate insulating film.

FIG. 2 is a cross-sectional view schematically illustrating a configuration of a MOSFET having a planar structure in which an AlON film formed by the film forming method according to the present exemplary embodiment.

Referring to FIG. 2, the MOSFET 16 includes: an n-type SiC portion 18 formed at a lower portion on a SiC substrate 17 that configures a wafer W and partially exposed on a surface of the SiC substrate 17; a second n-type SiC portion 19 formed at an upper portion and exposed on the surface of the SiC substrate 17, in which the second n-type SiC portion 19 is not entangled with the first n-type SiC portion 18; a p-type SiC portion 20 interposed between the first n-type SiC portion 18 and the second SiC portion 19 and partially exposed on the surface of the SiC substrate 17; and a gate insulating film 21 formed on the surface of the SiC substrate 17. Since the gate insulating film 21 is formed in a flat plate shape to cover the entire exposed portion of the first n-type SiC portion 18, the entire exposed portion of the p-type SiC portion 20, and a portion of the exposed portion of the second n-type SiC portion 19 on the surface of the SiC substrate 17, the gate insulating film 21 may be easily formed by laminating a plurality of films as in the film forming method according to the present exemplary embodiment as described below.

Meanwhile, there is no need for forming the SiC substrate 17 only by pure SiC and the SiC substrate 17 may be doped with impurities. In addition, the substrate that configures the wafer W is not limited to the SiC substrate 17 and may be, for example, a substrate made of gallium nitride (GaN) or diamond.

FIGS. 3A to 3E are process charts illustrating the film forming method according to the present exemplary embodiment.

In the film forming apparatus 10 or any other heat treatment apparatus, for example, a heat treatment furnace provided with a lamp heater (FIG. 3A), a thin silicon oxide ($SiO_2$) film 22 is formed on a surface of an SiC substrate 17, then one TMA molecule layer is formed on the surface of the SiC substrate 17 by the introduction of TMA from the gas introduction tube 13a and the subsequent exhaust of the inside of the chamber 11 and then, an AlN film 23 is formed by the introduction of $NH_3$ from the gas introduction tube 13c and the heating of the SiC substrate 17 (FIG. 3B) (first film forming step). In the film forming method according to the present exemplary embodiment, the formation of the AlN film 23 and the formation of the AlO film 24 are repeated as described below. The formation of the AlN film 23 which does not use an oxygen source such as, for example, $O_3$ is performed first. Thus, the oxidation of the surface of the SiC substrate 17 by oxygen atoms which pass through the thin $SiO_2$ film 22 may be suppressed. In addition, the thin $SiO_2$ film 22 is not essential, and when the thin $SiO_2$ film 22 is not formed, the thermal oxidation in the heat treatment furnace is not performed as well. Accordingly, the oxidation of the surface of the SiC substrate 17 may be suppressed more securely.

Subsequently, one TMA molecule layer is formed by the introduction of TMA from the gas introduction tube 13a and the subsequent exhaust of the inside of the chamber 11, then, an AlO film 24 is formed by the introduction of $O_3$ from the gas introduction tube 13b and the heating of the SiC substrate 17, and another AlN film 23 is formed on the fanned AlO film 24 in the same manner as FIG. 3B (FIG. 3C) (second film forming step).

Subsequently, the formation of the AlO film 24 and the formation of the AlN film 23 are repeated, thereby forming an AlON film 23 having a laminated structure in which AlO films 24 and AlN films 23 are alternately laminated. The AlON film 25 has a film thickness of 30 nm to 150 nm, preferably not less than 50 nm (FIG. 3D).

Meanwhile, the formation of the AlN film 23 and the formation of the AlO film 24 do not necessarily have to be performed alternately. A laminated structure having a predetermined film thickness may be formed by repeating the formation of the AlN film 23 by a predetermined number of times first, and then, repeating the formation of AlO film 24 by a predetermined number of times. The film thickness of the AlO film 24 or the AlN film 23 formed at a time is 0.1 nm to 20 nm, preferably 1 nm to 5 nm in light of realizing a uniform film thickness. Further, the AlO film 24 or the AlN film 23 may be formed not only by ALD but also by CVD (Chemical Vapor Deposition). Especially, when the film thickness is large, they may be suitably formed by CVD.

For example, as an example, the formation of the AlN film 23 and the formation of the AlO film 24 may be alternately repeated by 24 times by setting the film thickness of the AlO film 24 formed at a time to 0.36 nm and the film thickness of the AlN film 23 formed at a time to 3 nm. As such, an AlON film 25 having a thickness of about 80 nm and containing nitrogen of about 20 at % may be formed.

Figure 3A:
FIGS. 3A to 3F are process charts illustrating the film forming method according to the first exemplary embodiment.
Figure 3B:
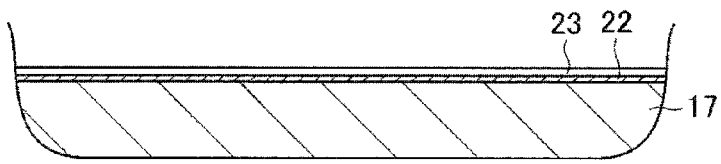
Figure 3C:
Figure 3D:
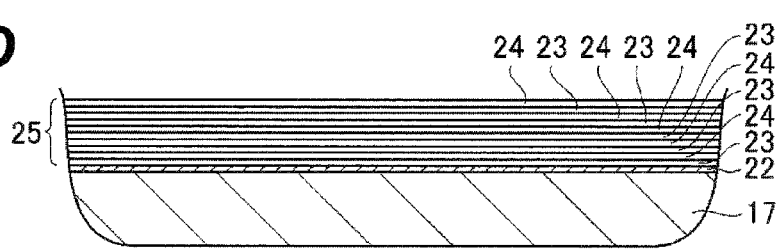
Figure 3E:
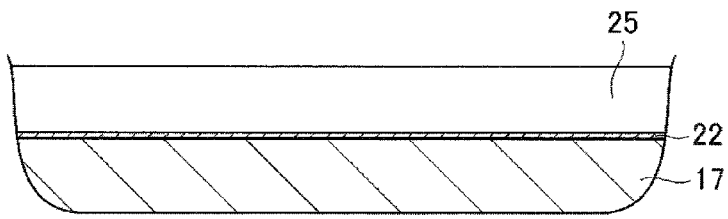
Figure 3F:
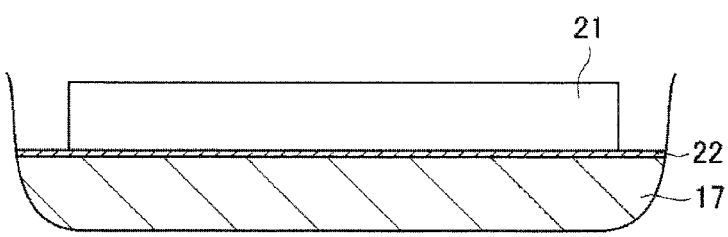

Subsequently, a heat treatment (annealing processing) is performed on the AlON film 25 by heating the SiC substrate 17 formed with the AlON film 25 to a temperature in the range of, for example, 600° C. to 1100° C., in the film forming apparatus 10 or any other heat treatment apparatus (FIG. 3E). In addition, a conventional photo process is performed on the SiC substrate 17, then the SiC substrate 17 is carried-in into a plasma etching apparatus, and an unnecessary portion of the AlON film 25 is removed by, for example, a dry etching, thereby obtaining a gate insulating film 21 (FIG. 3F). Thereafter, the present process is finished. The interfaces of the AlO films 24 and the AlN films 23 collapse by, for example, diffusion action of respective molecules in the annealing processing so that AlO molecules and AlN molecules are mixed up in the gate insulating film 21.

The film forming method according to the exemplary embodiment as described above may be performed not only by the film forming apparatus 10 but also by a film forming apparatus having any other configuration.

Figure 4:
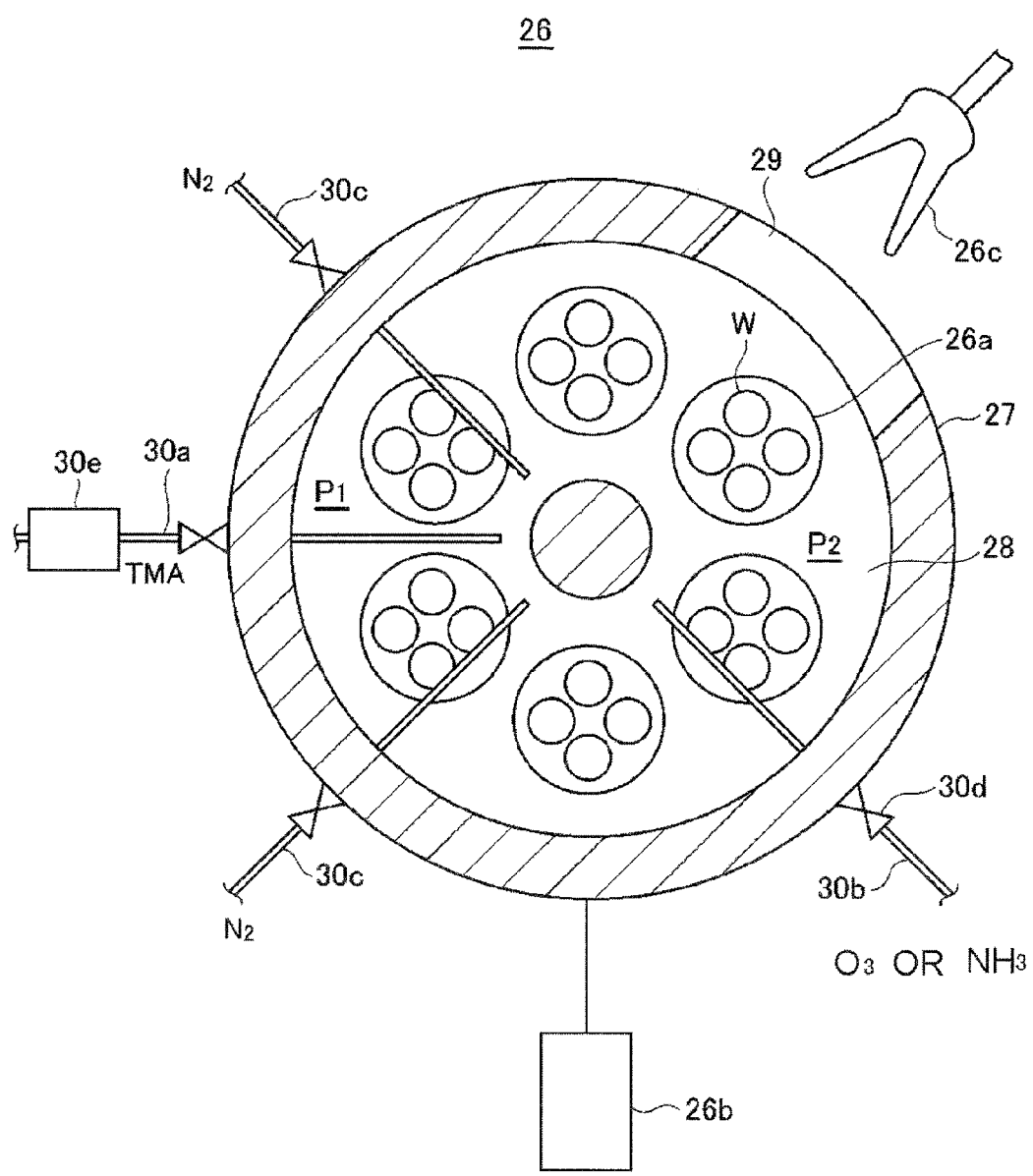
FIG. 4 is a horizontal cross-sectional view schematically illustrating a configuration of a semi-batch type film forming apparatus that performs the film forming method according to the first exemplary embodiment.

FIG. 4 is a horizontal cross-sectional view schematically illustrating a configuration of a semi-batch type film forming apparatus that performs the film forming method according to the exemplary embodiment.

Referring to FIG. 4, the film forming apparatus 26 includes: a chamber 27 having a cylindrical shape, a susceptor 28 having a disc shape and disposed within the chamber 27 to be rotated horizontally about the central axis of the chamber 27, a gate 29 configured to cause the chamber 27 to communicate with the outside, a gas introduction tube 30a configured to introduce TMA, a gas introduction tube 30b configured to introduce $O_3$ and $NH_3$ into the chamber 27 in a switching manner, and two gas introduction tubes 30c disposed between the gas introduction tubes 30a and 30b in the circumferential direction of the chamber 27, respectively, and configured to introduce $N_2$ into the chamber 27. The gas introduction tube 30a is provided with a purifier 30e in order to remove moisture.

The chamber 11 accommodates a plurality of, e.g. six flat boats 26a which are arranged at an equal interval in the circumferential direction in the susceptor 28. A plurality of wafers W are placed on each boat 26a and each boat 26a horizontally rotates about the central axis thereof. That is, each boat 26a revolves around the central axis of the chamber 27 while rotating on its central axis, and the wafers W placed on each boat 26a turns around the central axis of the chamber 27. Each boat 26a is carried-in/-out into/from the chamber 27 through the gate 29 by the arm 26c disposed outside of the chamber 27.

The susceptor 28 incorporates a heater (not illustrated) and heats each wafer W through each boat 26a. Meanwhile, the susceptor 28 may also incorporate a chiller (not illustrated) so as to cool each wafer W through each boat 26a.

In the film forming apparatus 26, when an AlN film 23 is formed by ALD, TMA is introduced into the chamber 27 from the gas introduction tube 30a, $NH_3$ is introduced into the chamber 27 through the gas introduction tube 30b, and $N_2$ is introduced into the chamber 27 from each of the gas introduction tubes 30c. The gas introduction tubes 30c introduce $N_2$ between the gas introduction tubes 30a and 30b, respectively, so that the inside of the chamber 27 is divided into a TMA adsorption region $P_1$ in which respective TMA molecules are chemically adsorbed to, for example, a surface of each wafer W so as to form a TMA molecule layer and a film forming region $P_2$ in which $NH_3$ is chemically reacted with the TMA molecule layer so as to form an AlN film 23. Since each wafer W sequentially passes through the TMA adsorption region $P_1$ and the film forming region $P_2$ while it turns around the central axis of the chamber 27, an AlN film 23 is formed at each turn of the wafer W.

When forming an AlO film 24 by ALD, TMA is introduced into the chamber 27 from the gas introduction tube 30a, $O_3$ is introduced into the chamber 27 from the gas introduction tube 30b, and $N_2$ is introduced into the chamber 27 from each of the gas introduction tubes 30c, thereby forming a TMA molecule layer in the TMA adsorption region $P_1$ and $O_3$ is chemically reacted with the TMA molecule layer, thereby forming an AlO film 24 in the film forming region $P_2$. Also in this case, since each wafer W sequentially passes through the TMA adsorption region $P_1$ and the film forming region $P_2$ while the wafer turns around the central axis of the chamber 27, an AlO film 24 is formed at each turn of the wafer. That is, in the film forming apparatus 26, when $O_3$ and $NH_3$ introduced from the gas introduction tubes 30b are switched, AlO films 24 and AlN films 23 may be alternately formed.

In addition, when a plurality of wafers W are placed on the boats 26a, respectively, and each of the boats 26a is revolved around the central axis of the chamber 27, an AlN film 23 or an AlO film 24 may be formed on the plurality of wafers substantially simultaneously. Meanwhile, each of the constituent elements of the film forming apparatus 26 is controlled by the controller 26b.

Also in the film forming apparatus 26, the gas introduction tubes 30b are placed adjacent to the film forming apparatus 26 so as to quickly switch the processing gases.

When the film forming method according to the present exemplary embodiment is performed using the film forming apparatus 26, a thin $SiO_2$ film 22 is formed on a surface of a SiC substrate 17 in the film forming apparatus 26 or any other heat treatment apparatus (FIG. 3A). Meanwhile, the $SiO_2$ film 22 is not essential and, when the $SiO_2$ film 22 is not formed, the oxidation of the surface of the SiC 17 may be suppressed.

Subsequently, in the film forming apparatus 26, one TMA molecule layer is formed on the surface of the SiC substrate 17 by the introduction of TMA from the gas introduction tube 30a and then, an AlN film 23 is formed by the introduction of $NH_3$ from the gas introduction tube 30c and the heating of the SiC substrate 17 (FIG. 3B) (first film forming step). Since the AlN film 23 is formed at first and thus, the thin $SiO_2$ film 22 is not exposed to an oxygen source, oxygen atoms may be suppressed from oxidizing the surface of the SiC substrate 17 by passing through the thin $SiO_2$ film 22.

Subsequently, one TMA molecule layer is formed by the introduction of TMA from the gas introduction tube 30a and then, an AlO film 24 is formed by the introduction of $O_3$ from the gas introduction tube 30b and the heating of the SiC substrate 17. Then, another AlN film 23 is formed on the formed AlO film 24 in the same manner as described above (FIG. 3C) (second film forming step).

Subsequently, the formation of the AlO film 24 and the formation of the AlN film 23 are repeated, thereby forming an AlON film 25 having a laminated structure in which AlO films 24 and AlN films 23 are alternately laminated (FIG. 3D), and a heat treatment (annealing processing) is performed on the AlON film 25 formed on the SiC substrate in the film forming apparatus 26 or any other heat treatment apparatus (FIG. 3E). In addition, a photo process is conducted by a conventional method and then, an unnecessary portion of the AlON film 25 is removed by, for example, a dry etching, thereby obtaining a gate insulating film 21 (FIG. 3F). Also in this case, the interfaces of the AlO films 24 and the AlN films 23 collapse by, for example, the diffusion action of respective molecules in the annealing processing so that AlO molecules and AlN molecules are mixed up in the gate insulating film 21.

Figure 10:
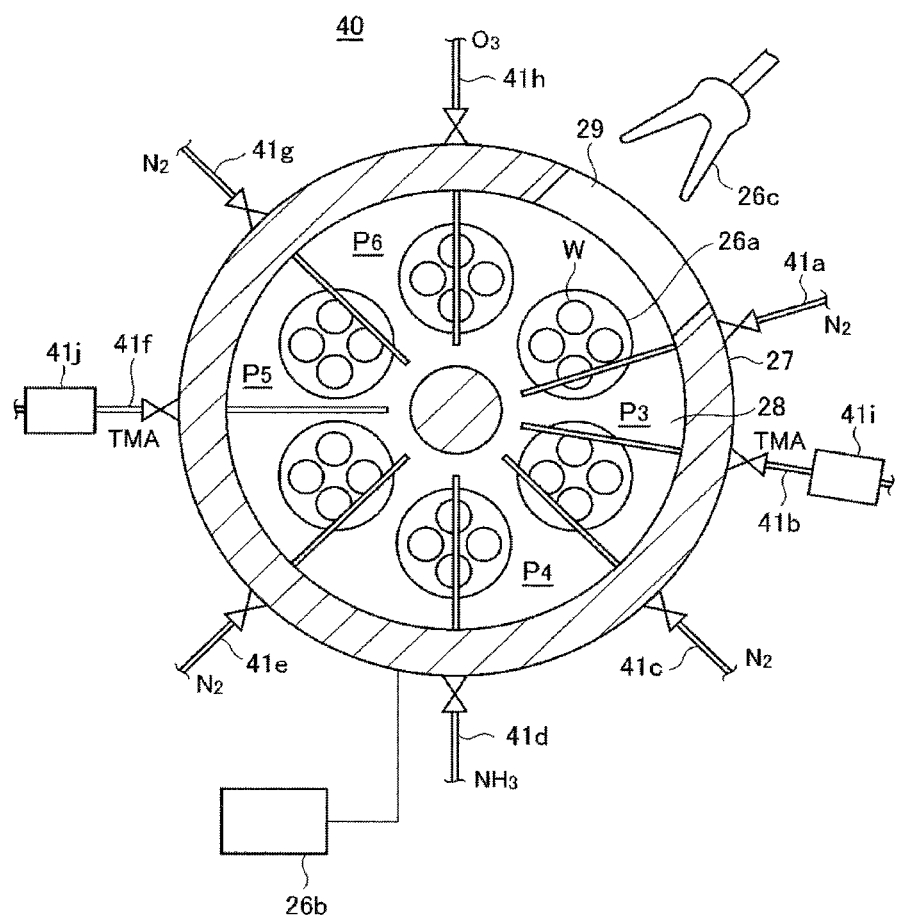
FIG. 10 is a horizontal cross-sectional view schematically illustrating a configuration of a modified example of the semi-batch type film forming apparatus of FIG. 4.

In the film forming apparatus 26 of FIG. 4 as described above, any one of the AlN film 23 and the AlO film 24 is formed on each wafer at each turn of the wafer W. However, the film forming apparatus may be configured such that both the AlN film 23 and the AlO film are formed on each wafer W at each turn of the wafer W makes one turn. For example, as illustrated in FIG. 10, in a film forming apparatus 40 having a configuration similar to that of the film forming apparatus 26, a gas introduction tube 41a configured to introduce $N_2$ into the chamber 27, a gas introduction tube 41b configured to introduce TMA into the chamber 27, a gas introduction tube 41c configured $N_2$ into the chamber 27, a gas introduction tube 41d configured NH$_3$ into the chamber 27, a gas introduction tube 41e configured to introduce N$_2$ into the 27, a gas introduction tube 41f configured to introduce TMA into the chamber 27, a gas introduction tube 41g configured to introduce N$_2$ into the chamber 27, and a gas introduction tube 41h configured to introduce O$_3$ into the chamber 27 may be arranged clockwise in the circumferential direction of the chamber 27, thereby dividing the inside of the chamber 27 into a TMA adsorption region P$_3$ in which respective TMA molecules are chemically adsorbed to, for example, a surface of each wafer W, an AlN film forming region P$_4$ in which NH$_3$ is chemically reacted with the TMA molecule layer to form an AlN film 23, a TMA adsorption region P$_5$ in which respective TMA molecules are chemically adsorbed to, for example, the surface of the wafer W, and an AlO film forming region P$_6$ in which O$_3$ is chemically reacted with the TMA molecule layer to form an AlO film 24.

In the film forming apparatus 40, whenever each wafer W makes a turn, the wafer W sequentially passes through the TMA adsorption region P$_3$, the AlN film forming region P$_4$, the TMA adsorption region P$_5$, and the AlO film forming region P$_6$. As a result, both the AlN film 23 and the AlO film 24 are formed on the wafer W whenever the wafer W makes a turn.

Also in the film forming apparatus 40, the gas introduction tubes 41b, 41f configured to introduce TMA are provided with purifiers 41i, 41j, respectively.

In the film forming apparatus 26, it is not required to form the AlN films 23 and the AlO films 24 alternately. While each wafer W is turned by a predetermined number of times, NH$_3$ may only be introduced from the gas introduction tube 30b in several turns from the beginning, and then O$_3$ may only be introduced from the gas introduction tube 30b in the subsequent several turns. Thus, in the several turns from the beginning, a laminated structure of a plurality of AlN films 23 is formed on each wafer W and in the subsequent several turns, a laminated structure of AlO films 24 is formed on each wafer W.

Figure 5:
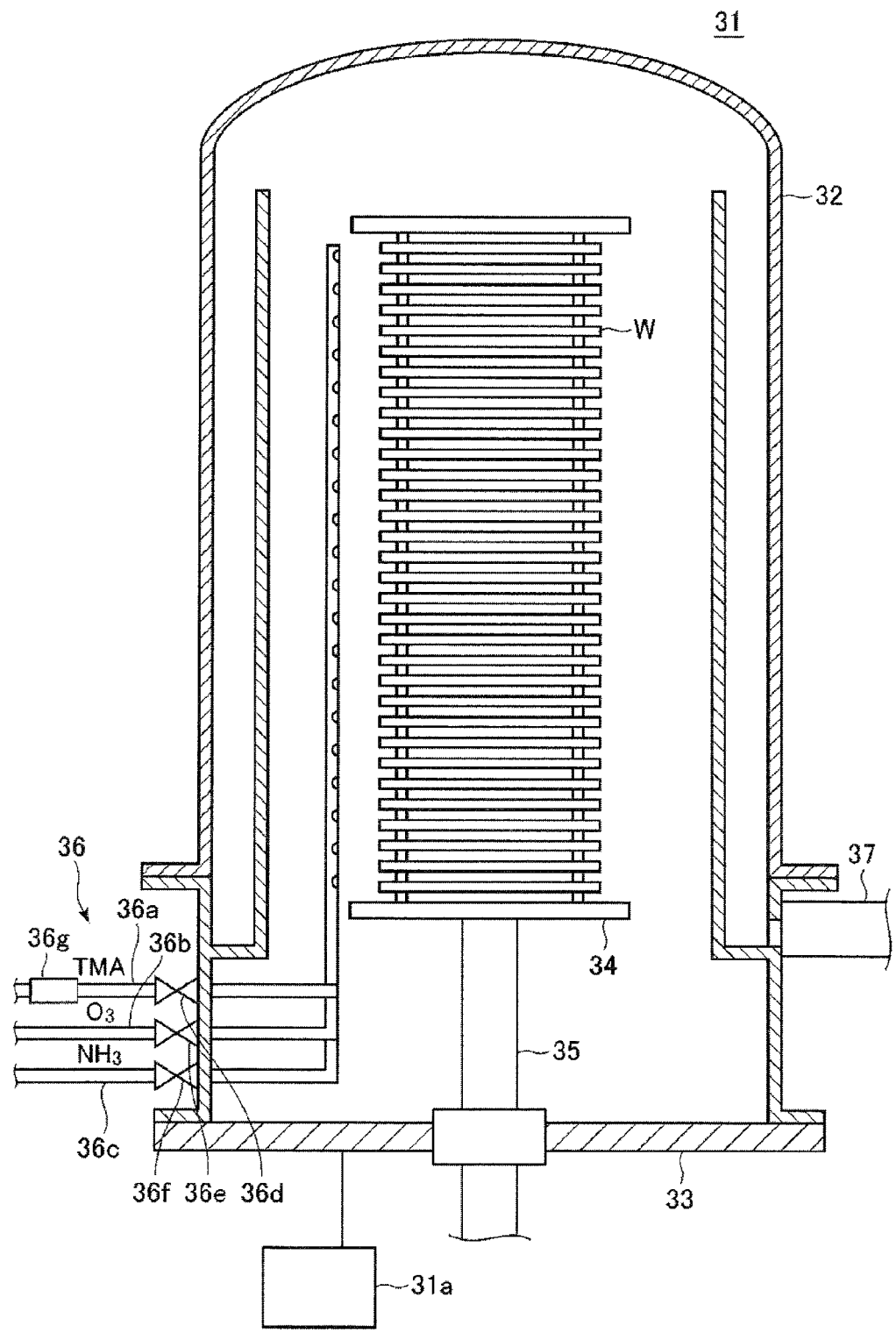
FIG. 5 is a cross-sectional view schematically illustrating a configuration of a batch type film forming apparatus that performs the film forming method according to the first exemplary embodiment.

FIG. 5 is a cross-sectional view schematically illustrating a batch-type film forming apparatus according to the present exemplary embodiment.

In FIG. 5, the film forming apparatus 31 includes a chamber 32 having a dual piping structure, a cover member 33 configured to close the lower end of the chamber 32, a wafer board 34 configured to dispose a plurality of wafers W in multiple tiers, a rotation shaft 35 configured to support the lower end of the wafer board 34, a gas introduction section 36 configured to introduce a processing gas into the chamber 32, an exhausting section 37 configured to exhaust the inside of the chamber 32, and a heater (not illustrated) configured to heat each of the wafers W disposed on the wafer board 34.

The inside of the chamber 32 is isolated from the external atmosphere when the film forming processing is performed on each of the wafers in the inside thereof using ALD. The gas introduction section 36 is made up of three gas introduction tubes 36a, 36b, 36c in which the gas introduction tube 36a introduces TMA, the gas introduction tube 36b introduces O$_3$, and the gas introduction tube 36c introduces NH$_3$. The wafer board 34 is configured to be separable from the chamber 32 together with the rotation shaft 35 or the cover member 33, and retreated downwardly from or introduced upwardly into the chamber 32. The operation of each constituent element of the film forming apparatus 31 is controlled by the controller 31a. Meanwhile, the gas introduction tube 36a configured to introduce TMA is provided with a purifier 36g so as to remove moisture.

In the film forming apparatus 31, when forming an AlO film 24, TMA is introduced from the gas introduction tube 36a so that respective TMA molecules are physically adsorbed to, for example, a surface of each wafer W, excess TMA molecules are discharged to the outside of the chamber 32 by the exhausting section 37, thereby forming one TMA molecule layer on the surface of each wafer W and then O$_3$ is introduced from gas introduction tube 36b and the wafer W is heated by the heater so as to cause O$_3$ to chemically react with the TMA molecule layer, thereby producing Al$_2$O$_3$ while discharging excess O$_3$ or a by-product to the outside of the chamber 32. When forming an AlN film 23, TMA is introduced from the gas introduction tube 36a so that respective TMA molecules are physically adsorbed to, for example, a surface of each wafer W and excess TMA molecules are discharged to the outside of the chamber 32 by the exhausting section 37, thereby forming one TMA molecule layer on the surface of each wafer W. Then, NH$_3$ is introduced from the gas introduction tube 36c and the wafers W are heated so as to cause NH$_3$ to chemically react with the TMA molecule layer, thereby producing an AlN film while discharging excess O$_3$ or a by-product to the outside of the chamber 32. That is, the film forming apparatus 31 may simultaneously produce an Al$_2$O$_3$ film and an AlN film having a thickness of several nanometers on a plurality of wafers W.

Also in the film forming apparatus 31, the gas introduction tubes 36a, 36b, 36c are provided with valves 36d, 36e, 36f, respectively. The valves 36d, 36e, 36f are disposed adjacent to the chamber 32 so as to ensure quick switching of processing gases. Since the sequence of performing the film forming method according to the present exemplary embodiment using the film forming apparatus 31 is substantially same as the sequence of performing the film forming method using the film forming apparatus 10, the descriptions thereof will be omitted.

With the film forming method according to the present exemplary embodiment, a foil led AlON film 25 has a laminated structure in which AlO films 24 and AlN films 23 are alternately layered. Thus, the AlN films 23 are substantially equally disposed in the thickness direction of the AlON film 25. In addition, since a heat treatment is performed on the AlON film 25 having the laminated structure, the laminated structure is eliminated by being annealed so that nitrogen contained in each of the AlN films 23 is diffused within the AlON film 25. As a result, even if the film thickness of the AlON film 25 is thick, nitrogen may be substantially uniformly diffused in the thickness direction. That is, an AlON film 25 which has a suitably controlled nitrogen density and is pressure-resistant may be obtained.

In the film forming methods according to the present exemplary embodiment described above, the content of nitrogen of the AlON film 25 be controlled within a range of about 1% to about 40% by adjusting the pressure of the chamber 11(27, 32) and/or the temperature of wafers W and furthermore, by adjusting the length of time for exposing the SiC wafers 17 to NH$_3$ and/or O$_3$.

In addition, in the film forming method according to the present exemplary described above, the thin SiO$_2$ film 22 is formed on a surface of a SiC substrate 17 prior to forming the AlON film 25. However, the AlN film 23 may be formed directly on the surface of the SiC substrate 17 without forming the SiO$_2$ film 22.

In the film forming method according to the present exemplary embodiment as described above, a SiC substrate 17 is heated so as to cause TMA to chemically react with NH$_3$ or O$_3$. However, plasma may be produced from NH$_3$ or O$_3$ within the chamber 11(27, 32) or plasma of NH$_3$ or O$_3$ may be introduced into the chamber 11(27, 32) so as to cause the plasma to chemically react with TMA.

Meanwhile, in the film forming method according to the present exemplary embodiment as described above, TMA is used as an aluminum source. However, other aluminum sources such as, for example, triethylaluminum, may be used. In addition, although $O_3$ is used as an oxygen source in the present exemplary embodiment, other oxygen sources such as, for example, oxygen, water, nitrous oxide, nitrogen oxide, carbon monoxide or carbon dioxide, may be used. Furthermore, $NH_3$ is used as a nitrogen source in the present exemplary embodiment, other nitrogen sources such as, for example, nitrogen, nitrous oxide or nitrogen oxide, may be used.

Figure 7:
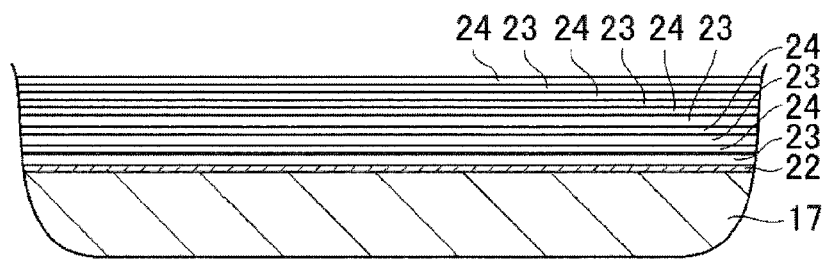
FIG. 7 is an enlarged cross-sectional view illustrating a configuration of an AlON film when respective AlN films are formed to have uneven thicknesses.

In the film forming method as described above, the thicknesses of respective AlO films 24 or the thicknesses of respective AlN films 23 may not equal to each other. For example, in the AlON film 25, when the concentration of nitrogen is increased only in an area adjacent to a surface of a SiC substrate 17, as illustrated in FIG. 7, the AlN film 23 formed in the vicinity of the surface of the SiC substrate 17 has a thick film thickness and the film thicknesses of the AlN films 23 are reduced as the distance from the surface of the SiC substrate 17 increases.

Figure 6:
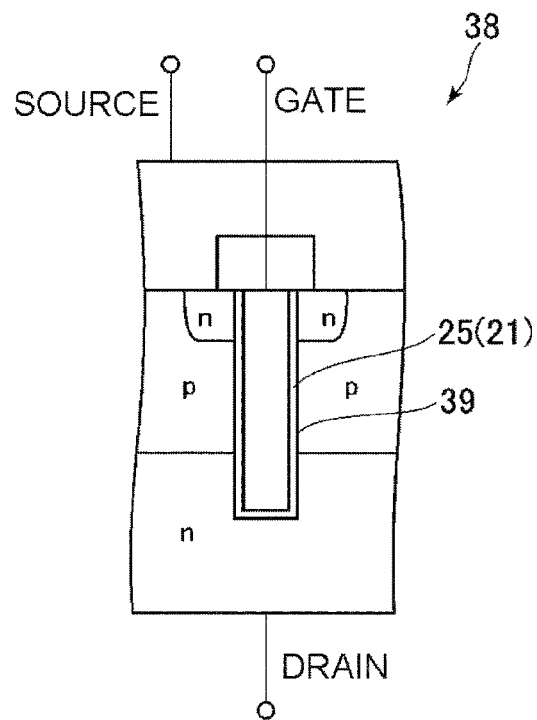
FIG. 6 is a cross-sectional view schematically illustrating a configuration of a MOSFET having a trench gate structure in which an AlON film formed according to the film forming method according to the first exemplary embodiment is used as a gate insulating film.

Further, even if the AlON film 25 as a gate insulating film 21 is formed in a trench 39 in a MOSFET 38 having a trench gate structure as illustrated in FIG. 6 using the film forming method as illustrated in FIGS. 3A to 3F, an AlN film 23 or an AlO film 24 may be formed in a substantially uniform film thickness along the inner surfaces of the trench 39 since ALD is excellent in coating property over steps. As a result, a homogeneous gate insulating film 21 may be produced. Since CVD is also relatively excellent in coating property over steps as compared with other film forming methods, the AlN film 23 or the AlO film 24 may also be formed in a substantially uniform film thickness along the inner surfaces of the trench 39 by CVD.

Although the film forming apparatuses 10, 26, 31 are used for forming an AlN film 23 or an AlO films 24 by ALD in the present exemplary embodiment as described above, the method of forming the AlN film 23 or the AlO film 24 is not limited to ALD and, for example, CVD or PVD (Physical Vapor Deposition) may also be used.

For example, when forming an AlN film 23 or an AlO film 24 by CVD in any of the film forming apparatuses 10(26, 31) as described above, TMA is introduced into the chamber 11(27, 32) in which a wafer W formed with a thin $SiO_2$ film 22 (SiC substrate 17) is accommodated, NH3 is introduced into the chamber 11(27, 32) without exhausting the inside of the chamber 11(27, 32), and the SiC substrate 17 is heated to cause TMA and $NH_3$ to chemically react with each other on the SiC substrate 17, thereby forming an AlN film 23.

Subsequently, an AlO film 24 is formed through a chemical reaction by introducing TMA, introducing $O_3$ and heating the SiC substrate 17 and an AlN film 23 is also formed through a chemical reaction in the same method as the above-described method. When the AlO film 24 or the AlN film 23 is formed by CVD, another AlO film 24 or another AlN film 23 which is relatively thick (e.g., about 20 nm) may be formed.

Subsequently, the formation of the AlO film 24 and the formation of the AlN film 23 by CVD are repeated, thereby an AlON film 25 having a laminated structure in which AlO films 24 and AlN films 23 are alternately laminated and a heat treatment (annealing processing) is performed on the AlON film 25. In addition, a conventional photo process is performed on the SiC substrate 17 and then, an unnecessary portion of the AlON film 25 is removed by, for example, a dry etching, thereby obtaining a gate insulating film 21.

In ALD as described above, after introducing TMA into the chamber 11(27, 32), all the excess TMA molecules are discharged to the outside of the chamber 11(27, 32) so as to form one TMA molecule layer. However, $O_3$ or $NH_3$ may be introduced before all the TMA molecules are discharged. In such a case, an AlO film 24 or an AlN film 23 having a thickness which is slightly thicker than the one TMA molecular layer is formed.

Specifically, TMA is introduced into the chamber 11(27, 32) in which a wafer W formed with a thin $SiO_2$ film 22 (SiC substrate 17) is accommodated, $NH_3$ is introduced into the chamber 11(27, 32) while exhausting the inside of the chamber 11(27, 32) but before all the excess TMA molecules are discharged, and the SiC substrate 17 is heated to cause TMA and $NH_3$ to chemically react with each other on the SiC substrate 17, thereby forming an AlN film 23.

Subsequently, an AlO film 24 is formed through a chemical reaction by the introduction of TMA, the introduction of $O_3$ prior to discharging all the excess TMA molecules $O_3$, and the heating of the SiC substrate 17. In addition, in the same method as the above-described method, an AlN film 23 is formed through a chemical reaction. In the present method, since all the excess TMA molecules are not discharged when forming the AlO film 24 or when forming the AlN film 23, a slightly thick AlO film 24 or AlN film 23 is formed.

Subsequently, the formation of the AlO film 24 and the formation of the AlN film 23 as described above are repeated, thereby forming an AlON film 25 having a laminated structure in which the AlO films 24 and the AlN films 23 are alternately laminated and a heat treatment (annealing processing) is performed on the AlON film 25. In addition, a conventional photo process is performed on the SiC substrate 17 and then, an unnecessary portion of the AlON film 25 is removed by, for example, a dry etching, thereby obtaining a gate insulating film 21.

Subsequently, a film forming method according to a second exemplary embodiment of the present disclosure will be described.

The film forming method according to the present exemplary embodiment is different from the first exemplary embodiment in that AlN films 23 are only formed without forming an AlO film 24 and the oxidation of the formed AlN films 23 is performed. The film forming method according to the present exemplary embodiment may also be performed using not only the film forming apparatus 10 but also the film forming apparatuses 26, 31. Hereinafter, a case in which the film forming method is performed using the film forming apparatus 10 will be described as a representative example.

FIGS. 8A to 8F are process charts illustrating the film forming method according to the present exemplary embodiment.

Figure 8A:
FIGS. 8A to 8F are process charts illustrating a film forming method according to a second exemplary embodiment of the present disclosure.
Figure 8B:
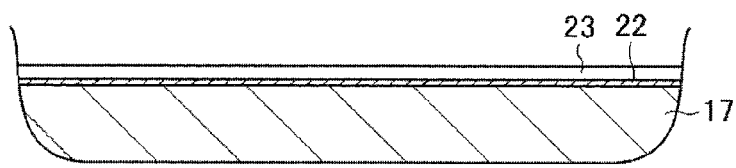
Figure 8C:

In the film forming apparatus 10 or any other heat treatment apparatus, a thin silicon oxide ($SiO_2$) film 22 is formed on a surface of a SiC substrate 17 (FIG. 8A). Meanwhile, the thin $SiO_2$ film 22 is not essential and, when the thin $SiO_2$ film 22 is not formed, the oxidation of the surface of the SiC substrate 17 may be suppressed.

Subsequently, in the film forming apparatus 10, one TMA molecule layer is formed by introducing TMA from the gas introduction tube 13a and subsequently exhausting the inside of the chamber 11, and then, an AlN film 23 is formed by introducing $NH_3$ from the gas introduction tube 13c and heating the SiC substrate 17 (FIG. 8B) (film forming step).

Subsequently, the AlN film 23 is oxidized by introducing O₃ from the gas introduction tube 13b and heating the SiC substrate 17, thereby producing an oxidized AlN film 23a (FIG. 8C) (oxidation step).

Figure 8D:
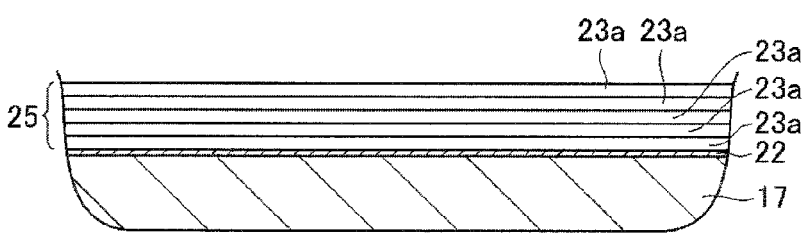

Subsequently, the formation of the AlN film 23 and the oxidation of the AlN film 23 are repeated, thereby forming an AlON film 25 having a laminated structure of oxidized AlN films 23a. The film thickness of the AlON film is in the range of 30 nm to 150 nm, preferably not less than 50 nm (FIG. 8D). For example, the film thickness of the AlN film 23 formed at a time is in the range of 0.1 nm to 20 nm and an oxidation time of the AlN film 23 is in the range of 0.1 sec to 120 sec. Meanwhile, the AlN film 23 may be formed not only by ALD but also by CVD. Specially, when the film thickness is thick, the AlN film 23 may be suitably formed by CVD.

For example, the film thickness of the AlN film 23 formed at a time is set to 2 nm, the concentration of O₃ within the chamber 11 when oxidizing the AlN film 23 is set to 100 g/cm³ to 400 g/cm³, the pressure within the chamber 11 is set to 1 Torr, and then oxidation is performed for 10 seconds. Under these conditions, the formation of the AlN film 23 and the oxidation of the AlN film 23 are alternately repeated by 40 times. As such, an AlON film 25 having a thickness of about 80 nm and containing nitrogen of about 10 at % may be formed.

Figure 8E:
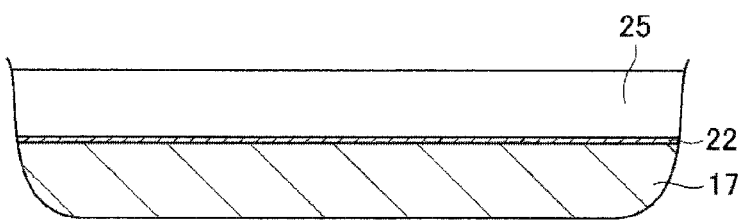
Figure 8F:
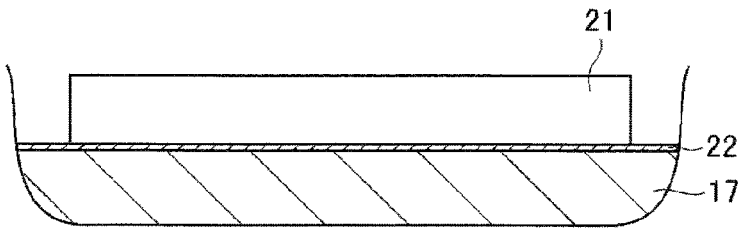

Subsequently, a heat treatment (annealing processing) is performed on the AlON film by heating the SiC substrate 17 formed with the AlON film 25 to a temperature in the range of, for example, 600° C. to 1100° C., in the film forming apparatus 10 or any other heat treatment apparatus (FIG. 8E). In addition, a conventional photo process is performed on the SiC substrate 17 and then, the SiC substrate 17 is carried-in into a plasma etching apparatus and an unnecessary portion of the AlON film 25 is removed by, for example, a dry etching, thereby obtaining a gate insulating film 21 (FIG. 8F). Then, the present process is finished. The respective interfaces of in the AlON film 25 collapse by, for example, the diffusion action of respective molecules in the annealing processing so that AlO molecules and AlN molecules are mixed up in the gate insulating film 21.

With the film forming method according to the present exemplary embodiment, since the formation of the AlN film 23 and the oxidation of the AlN film 23 are repeated alternately, AlN films 23 is oxidized whenever they are formed. Thus, the film thickness of the AlN film 23 formed at a time may be set to be small so that the AlN film 23 may be uniformly oxidized. In addition, the uniformly oxidized AlN films 23a are laminated to form an AlON film 25. As a result, even if the film thickness of the AlON film 25 is large, the AlON film 25 may be homogenized in the film thickness direction. Further, since a heat treatment is performed on the AlON film 25 having the laminated structure, the laminated structure is eliminated by being annealed so that nitrogen contained in each of the oxidized AlN films 23a is diffused in the AlON film 25. As a result, even if the film thickness of the AlON film 25 is large, nitrogen may be substantially uniformly diffused in the thickness direction. That is, an AlON film 25 which has a suitably controlled nitrogen density and is pressure-resistant may be obtained.

Meanwhile, the formation of the AlN film 23 and the oxidation of the AlN film 23 do not necessarily have to be performed alternately. A laminated structure having a predetermined film thickness may be formed by repeating the formation of the AlN film 23 by a predetermined number of times first and then repeating the oxidation of the AlN film 23 by the predetermined number of times.

In addition, in the film forming method according to the present exemplary embodiment, AlN films 23 may also be formed by CVD or PVD rather than by ALD.

For example, when forming an AlN film 23 by CVD in any of the film forming apparatuses 10(26,31) as described above, TMA is introduced into the chamber 11(27, 32) in which a wafer W formed with a thin SiO₂ film 22 (SiC substrate 17) is accommodated, NH₃ is introduced into the chamber 11(27, 32), and the SiC substrate 17 is heated to cause TMA and NH₃ to chemically react with each other on the SiC substrate 17, thereby forming an AlN film 23. When the AlN film 23 is formed by CVD, excess TMA molecules are not discharged to the outside of the chamber 11(27, 32) unlike ALD. Thus, a relatively thick (e.g., about 20 nm) AlN film 23 is formed.

Subsequently, an oxidized AlN film 23a is produced by introducing O₃ and heating the SiC substrate 17. Further, the formation of the AlN film 23 by CVD and the oxidation of the AlN film 23, thereby forming an AlON film 25 having a laminated structure of oxidized AlN films 23a and a heat treatment (annealing processing) is performed on the AlON film 25. In addition, a conventional photo process is performed on the SiC substrate 17 and then, an unnecessary portion of the AlON film 25 is removed by, for example, a dry etching, thereby obtaining a gate insulating film 21.

In ALD as described above, after introducing TMA into the chamber 11(27, 32), all the excess TMA molecules are discharged to the outside of the chamber 11(27, 32) so as to form one TMA molecule layer. However, NH₃ may be introduced before all the TMA molecules are discharged. In such a case, an AlN film 23 having a thickness which is slightly thicker than the TMA molecular layer is formed.

Specifically, TMA is introduced into the chamber 11(27, 32) in which a wafer W formed with a thin SiO₂ film 22 (SiC substrate 17) is accommodated, NH₃ is introduced into the chamber 11(27, 32) while exhausting the inside of the chamber 11(27, 32) but before all the excess TMA molecules are discharged, and the SiC substrate 17 is heated to cause TMA and NH₃ to chemically react with each other on the SiC substrate 17, thereby forming an AlN film 23.

Subsequently, an oxidized AlN film 23a is produced by introducing O₃ and heating the SiC substrate 17, and the formation of the AlN film 23 by CVD and the oxidation of the AlN film 23 are repeated, thereby forming an AlON film 25 having a laminated structure of oxidized AlN films 23a. In addition, a heat treatment (annealing processing) is performed on the AlON film 25, a conventional photo process is performed on the SiC substrate 17, and then, an unnecessary portion of the AlON film 25 is removed by, for example, a dry etching, thereby obtaining a gate insulating film 21.

In addition, the oxidation of the AlN films 23 may be performed by plasma generated from O₃ within the chamber 11 or plasma of O₂ introduced from the gas introduction tube 13b rather than by the heating of the SiC substrate 17.

In the film forming method according to the present exemplary embodiment as described above, the oxidation degrees of respective formed AlN films 23 may not be equal to each other. For example, when increasing the concentration of nitrogen only in the portion adjacent to the surface of the SiC in the AlON film 25, an oxidation time of the AlN film 23 formed in the vicinity of the surface of the SiC substrate 17 may be shortened. Therefore, an unnecessary oxidation time may be reduced, thereby improving throughput.

Subsequently, a film forming method according to a third exemplary embodiment of the present disclosure will be described.

The film forming method according to the present exemplary embodiment is different from the first exemplary embodiment in that AlO films 24 are only formed without forming an AlN film 23 and nitridation is performed on the formed AlO films 24. The film forming method according to the present exemplary embodiment may also be performed using not only the film forming apparatus 10 but also the film forming apparatuses 26, 31. Hereinafter, a case in which the film forming method is performed using the film forming apparatus 10 will be described as a representative example.

FIGS. 9A to 9F are process charts illustrating the film forming method according to the present exemplary embodiment.

Figure 9A:
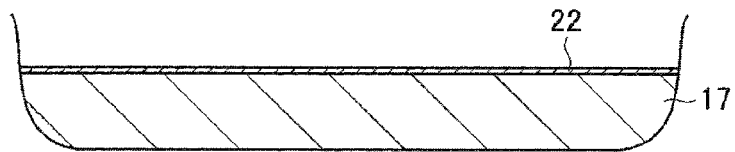
FIGS. 9A to 9F are process charts illustrating a film forming method according to a third exemplary embodiment of the present disclosure.
Figure 9B:
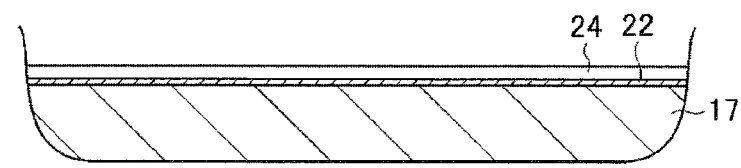
Figure 9C:

In the film forming apparatus 10 or any other heat treatment apparatus, a thin silicon oxide ($SiO_2$) film 22 is formed on a surface of a SiC substrate 17 (FIG. 9A). Meanwhile, the thin $SiO_2$ film 22 is not essential and, when the thin $SiO_2$ film 22 is not formed, the oxidation of the surface of the SiC substrate 17 may be suppressed.

Subsequently, in the film forming apparatus 10, one TMA molecule layer is formed by introducing TMA from the gas introduction tube 13a and subsequently exhausting the inside of the chamber 11, and then, an AlO film 24 is formed by introducing $O_3$ from the gas introduction tube 13b and heating the SiC substrate 17 (FIG. 9B) (film forming step).

Subsequently, the AlO film 24 is nitrided by plasma which is formed within the chamber 11 by introducing $NH_3$ or $N_2$ as a nitrogen source from the gas introduction tube 13c, thereby forming a nitrided AlO film 24a (FIG. 9C) (nitridation step).

Figure 9D:
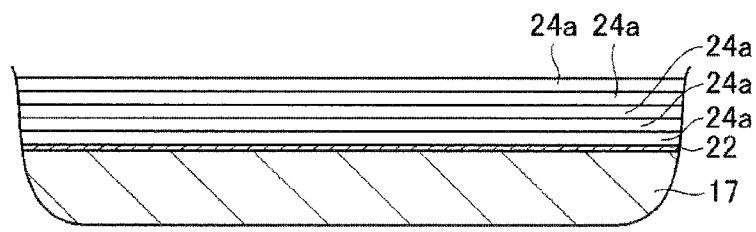
Figure 9E:
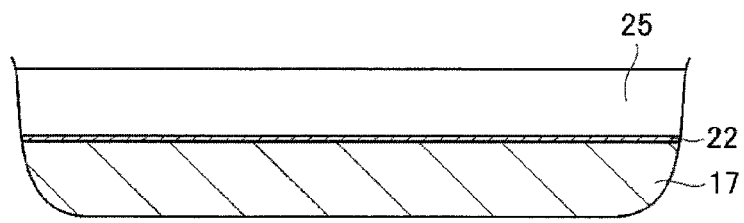

Subsequently, the formation of the AlO film 24 and the nitridation of the AlO film 24 are repeated, thereby forming an AlON film 25 having a laminated structure of nitrided AlO films 24a. The film thickness of the AlON film 25 is 30 nm to 150 nm, preferably not less than 50 nm (FIG. 9D). For example, the film thickness of an AlO film 24 formed at a time is in the range of 0.1 nm to 20 nm and a nitridation time of the AlO film 24 by plasma is in the range of 1 sec to 600 sec. Meanwhile, AlO films 24 may be formed not only by ALD but also by CVD. Specially, when the film thickness is large, the AlO films 24 may be suitably formed by CVD.

Figure 9F:
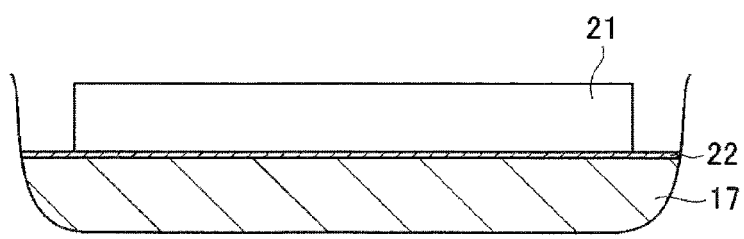

Subsequently, the SiC substrate 17 formed with the AlON film 25 is heated to a temperature in the range of, for example, 600° C. to 1100° C., in the film forming apparatus 10 or any other heat treatment apparatus so as to perform a heat treatment (annealing processing) on the AlON film (FIG. 9E) and further a conventional photo process is performed on the SiC substrate 17. Then, the SiC substrate 17 is carried-in into a plasma etching apparatus so as to remove an unnecessary portion of the AlON film 25 by, for example, a dry etching, thereby obtaining a gate insulating film 21 (FIG. 9F). Then, the present process is finished. The respective interfaces of in the AlON film 25 collapse by, for example, diffusion action of respective molecules in the annealing processing so that AlO molecules and AlN molecules are mixed up in the gate insulating film 21.

With the film forming method according to the present exemplary embodiment, since the formation of the AlO film 24 and the nitridation of the AlO film 24 are repeated alternately, the AlO films 24 are nitrided whenever they are formed. Thus, the film thickness of the AlO film 24 formed at a time may be set to be small so that the AlO film 24 may be uniformly nitrided. In addition, uniformly nitrided AlO films 24a are laminated to form an AlON film 25. As a result, even if the film thickness of the AlON film 25 is large, the AlON film 25 may be homogenized in the film thickness direction. Further, since a heat treatment is performed on the AlON film 25 having the laminated structure, the laminated structure is eliminated by being annealed so that nitrogen contained in each of the nitrided AlO films 24a is diffused in the AlON film 25. As a result, even if the film thickness of the AlON film 25 is large, nitrogen may be substantially uniformly diffused in the thickness direction. That is, an AlON film 25 which has a suitably controlled nitrogen density and is pressure-resistant may be obtained.

Meanwhile, the formation of the AlO film 24 and the nitridation of the AlO film 24 do not necessarily have to be performed alternately. The laminated structure having a predetermined film thickness may be formed by repeating the formation of AlO film 24 by a predetermined number of times first and then repeating the nitridation of the AlO film 24 by the predetermined number of times.

In addition, in the film forming method according to the present exemplary embodiment, AlO films 24 may also be formed by CVD or PVD rather than by ALD.

For example, when AlO films 24 are formed by CVD in any of the film forming apparatuses 10(26, 31) as described above, TMA is introduced into the chamber 11(27, 32) in which a wafer W formed with a thin $SiO_2$ film 22 (SiC substrate 17) is accommodated, $O_3$ is introduced into the chamber 11(27, 32), and the SiC substrate 17 is heated to cause TMA and $O_3$ to chemically react with each other on the SiC substrate 17, thereby forming an AlO film 24. When an AlO film 24 is formed by CVD, a relatively thick (e.g., about 20 nm) AlO film 24 is formed since excess TMA molecules are not discharged to the outside of the chamber 11(27, 32) unlike ALD.

Subsequently, a nitrided AlO film 24a is produced by nitridation by plasma of $NH_3$ or $N_2$ within the chamber 11(27, 32). Further, the formation of the AlO film 24 by CVD and the nitridation of the AlO film 24 are repeated, thereby forming an AlON film 25 having a laminated structure of nitrided AlO films 24a and a heat treatment (annealing processing) is performed on the AlON film 25. In addition, a conventional photo process is performed on the SiC substrate 17 and then, an unnecessary portion of the AlON film 25 is removed by, for example, a dry etching, thereby obtaining a gate insulating film 21.

In ALD as described above, after introducing TMA into the chamber 11(27, 32), all the excess TMA molecules are discharged to the outside of the chamber 11(27, 32) so as to form one TMA molecule layer. However, $O_3$ may be introduced before all the TMA molecules are discharged. In such a case, an AlO film 24 having a thickness which is slightly thicker than the one TMA molecular layer is formed.

Specifically, TMA is introduced into the chamber 11(27, 32) in which a wafer W formed with a thin $SiO_2$ film 22 (SiC substrate 17) is accommodated, $O_3$ is introduced into the chamber 11(27, 32) while exhausting the inside of the chamber 11(27, 32) but before all the excess TMA molecules are discharged, and the SiC substrate 17 is heated to cause TMA and $O_3$ to chemically react with each other on the SiC substrate 17, thereby forming an AlO film 24.

Subsequently, a nitrided AlO film 24a is produced by nitridation by plasma of $NH_3$ or $N_2$ generated in the chamber 11(27, 32), the formation of the AlO film 24 by CVD and the nitridation of the AlO film 24 are repeated, thereby forming an AlON film 25 having a laminated structure of nitrided AlO films 24a, and a heat treatment (annealing processing) is performed on the AlON film 25. In addition, a conventional photo process is performed on the SiC substrate 17, and then, an unnecessary portion of the AlON film 25 is removed by, for example, a dry etching, thereby obtaining a gate insulating film 21.

The nitridation of the AlO films 24 may be performed by heating the SiC substrate 17 rather than by plasma.

In the film forming method according to the present exemplary embodiment as described above, the nitridation degrees of respective formed AlO films 24 may not be equal to each other. For example, when increasing the concentration of nitrogen only in the portion adjacent to the surface of the SiC in the AlON film 25, a nitridation time of the AlO film 24 formed in the vicinity of the surface of the SiC substrate 17 may be increased. Therefore, an unnecessary nitridation time may be reduced, thereby improving throughput.

Meanwhile, when forming an AlN film 23 or an AlO film 24 by ALD or CVD, the temperature within the chamber 11 during film-forming may be in the range of 100° C. to 750° C. This temperature range is desirable due to the following reasons. When the film forming temperature is 700° C. or higher, the AlN film may be crystallized as the AlN film is heated. In such a case, since crystal grain boundaries may be generated in the AlN film 23 and the crystal grain boundaries may form a leak path, an amorphous AlON film 25 which is excellent as an insulating film may not be obtained. When the film forming temperature is about 700° C., an effect of omitting an annealing processing in the subsequent process may be expected. That is, in consideration of suppressing the generation of crystal grain boundaries and the simplification of processing, it is desirable that the film forming temperature is not higher than 750° C.

In addition, when the AlN film 23 or the AlO film 24 is formed at a high temperature, diffusion may occur between the AlN film 23 or AlO film 24 and a thin SiO2 film 22 as an underlayer, thereby causing deterioration in film quality or electric characteristic. Accordingly, it is more desirable that the temperature within the chamber 11 during film-forming is in the range of 250° C. to 400° C. Specially, when the temperature is 400° C. or less, the crystallization of AlN or the deterioration of $SiO_2$ film 22 may be suppressed and thus, an amorphous AlON film 25 may be obtained. In consideration of facilitation of chemical reaction during film-forming, it is more desirable that the temperature within the chamber 11 during film-forming is in the range of 300° C. to 400° C.

In each of the film forming methods of the exemplary embodiments as described above, the AlN film 23 or the AlO film 24 is formed by ALD or CVD. However, the method of forming the AlN film 23 or the AlO film 24 is not limited thereto. For example, the AlN film 23 or the AlO film 24 may also be obtained by forming an Al film by ALD, CVD or PVD and performing a nitridation processing or an oxidation processing on the Al film.

Although the present disclosure has been described above using exemplary embodiments, the present disclosure is not limited to the exemplary embodiments.

Further, the object of the present disclosure may also be achieved when a storage medium in which software program codes that implement functions of each of the exemplary embodiments as described above are stored is provided to a computer (e.g., the controller of the film forming apparatus 10(26, 31)) and the program codes stored in the storage medium are read and executed by the CPU of the computer.

In such a case, since the program codes read from the storage medium implement the functions of each of the exemplary embodiments as described above, the program codes and the storage medium that stores the program codes will configure the present disclosure.

As for the storage medium for supplying the program codes, for example, a RAM, a NV-RAM, a floppy (registered trademark) disc, a hard disc, a magneto-optical disc, an optical disc such as a CD-ROM, CD-R, CD-RW or DVD (DVD-ROM, DVD-RAM, DVD-RW, DVD+RW), a magnetic tape, a non-volatile memory card or any other ROM which may store the program codes may be used. Alternatively, the program codes may be supplied to the computer by downloading the program codes from, for example, any other computer or database that is connected to the Internet, a commercially available network, or a local area network.

In addition to the case in which the functions of each of the exemplary embodiments are implemented by executing the program codes read by the computer, a case in which, based on the program codes, and for example, an OS (operating system) operated on a CPU performs some or the entirety of actual processings so that the functions of each of the exemplary embodiments as described above are implemented by the processings is also included in the present disclosure.

Further, a case in which program codes read from the storage medium is stored in a function extension board inserted into the computer or a function extension unit connected to the computer, and then, for example, a CPU provided in the function extension board or the function extension unit performs some or the entirety of actual processings based on the commands of the program codes so that the functions of each of the exemplary embodiments as described above are implemented is also included in the present disclosure.

The program codes may be configured in the forms of, for example, object codes, program codes executed by an interpreter, or script data supplied to an OS.

EXAMPLE

Next, an Example of the present disclosure will be described.

When forming gate insulating films of MOSFETs, AlON films 25 were formed by setting the pressure within the chamber 11 to 0.35 Torr, setting the temperature within the chamber 11 to 350° C., and then repeating the formation of the AlN film 23 by ALD and the oxidation of the AlN film 23 was repeated (Example). Meanwhile, the thickness of each of the AlN films 23 was 3 nm. Since the AlON films 25 were formed as samples for test, the thickness thereof was set to 30 nm.

Meanwhile, when forming the gate insulating films of MOSFETs, $Al_2O_3$ films were formed by a deposition method (Comparative Example).

Figure 11:
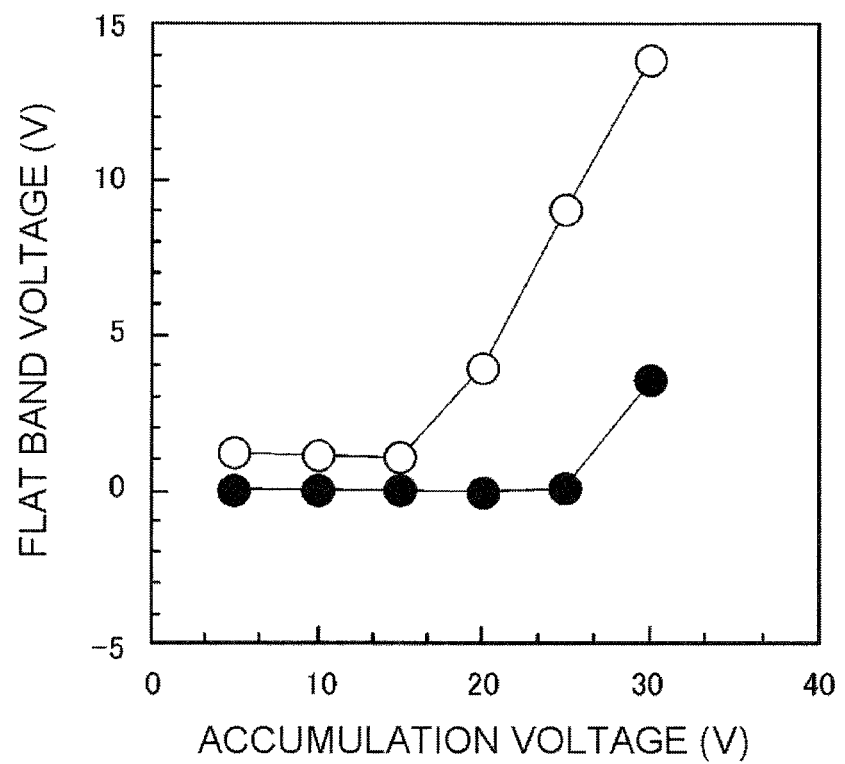
FIG. 11 is a graph illustrating flat band shifts of an $Al_2O_3$ film and AlON film as gate insulating films.

Thereafter, for the MOSFETs of Example and Comparative Example, flat band voltages were measured. As illustrated in FIG. 11, in the comparative example, a large flat band shift has been confirmed. However, in the Example of the present disclosure, such a large flat band shift has not been confirmed. As a result, it has been found out that in the AlON films 25 of the Example, electron traps have been eliminated by adding nitrogen.

In addition, in order to confirm a coating property over steps of the AlON film 25 when AlN films 23 were formed by CVD, an AlON film 25 having a thickness of about 60 nm was formed by setting the pressure within the chamber 11 to 0.30 Torr, setting the temperature within the chamber 11 to 380° C., and then repeating the formation of the AlN film 23 by CVD and the oxidation of the AlN film 23 and a trench structure on a wafer W was coated with the AlON film 25.

Figure 12:
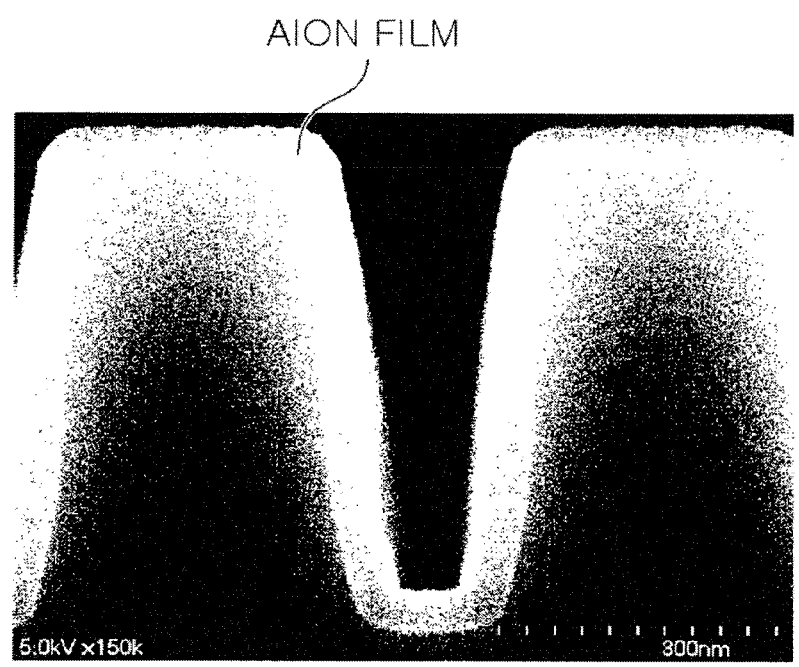
FIG. 12 is a cross-sectional view illustrating a coating property over steps of an AlON film in a trench structure.

Thereafter, it has been confirmed from the cross-sectional structure of the trench that the inner surfaces of the trench were covered by the AlON film 25 in a substantially uniform film thickness as illustrated in FIG. 12. That is, it has been found out that when a gate insulating film is formed by an AlON film 25 in a MOSFET having a trench structure having an aspect ratio of about 4, the AlN film 23 may be formed by CVD.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method of forming a gate insulating film for use in a MOSFET for a power device, the method comprising:
   forming an AlN film;
   forming an AlO film; and
   repeating the forming the AlN film and the forming the AlO film, thereby forming an AlON film having a laminated structure in which AlO films and AlN films are alternately laminated.

2. The method of claim 1, wherein the film thickness of the AlON film is 50 nm or more.

3. The method of claim 1, wherein the AlON film is formed on a substrate and the substrate includes any one of silicon carbonate, gallium nitride and diamond.

4. The method of claim 1, wherein a heat treatment is performed on the AlON film having the laminated structure.

5. The method of claim 1, wherein the AlN film formed at the very first among the AlN films is formed before the AlO film formed at the very first among the AlO films.

6. The method of claim 1, wherein the formation of the AlN film and/or the formation of the AlO film are performed by ALD, CVD or PVD.

7. A method of forming a gate insulating film for use in a MOSFET for a power device, the method comprising:
   forming an AlN film;
   oxidizing the AlN film after the AlN film is formed; and
   repeating the forming the AlN film and the oxidizing the AlN film alternately, thereby forming an AlON film having a laminated structure in which oxidized AlN films are laminated.

8. The method of claim 7, wherein the film thickness of the AlON film is 50 nm or more.

9. The method of claim 7, wherein the AlON film is formed on a substrate and the substrate includes any one of silicon carbonate, gallium nitride and diamond.

10. The method of claim 7, wherein a heat treatment is performed on the AlON film having the laminated structure.

11. The method of claim 7, wherein the formation of the AlN film is performed by ALD, CVD or PVD.

12. A method of forming a gate insulating film for use in a MOSFET for a power device, the method comprising:
    forming an AlO film;
    nitriding the AlO film after the AlO film is formed; and
    repeating the forming the AlO film and the nitriding the AlO film alternately, thereby forming an AlON film having a laminated structure in which nitrided AlO films are laminated.

13. The method of claim 12, the film thickness of the AlON film is 50 nm or more.

14. The method of claim 12, wherein the AlON film is formed on a substrate and the substrate includes any of silicon carbonate, gallium nitride and diamond.

15. The method of claim 12, wherein a heat treatment is performed on the AlON film having the laminated structure.

16. The method of claim 12, wherein the formation of the AlO film is performed by ALD, CVD or PVD.

17. A film forming apparatus comprising:
    a film forming unit configured to form an AlN film and an AlO film,
    wherein the film forming unit repeats a formation of the AlN film and a formation of the AlO film, thereby forming an AlON film having a laminated structure in which AlO films and AlN films are alternately laminated.

18. A film forming apparatus comprising:
    a film forming unit configured to form an AlN film; and
    an oxidation unit configured to oxidize the AlN film after the AlN film is formed,
    wherein the film forming unit and the oxidation unit repeat the formation of the AlN film and the oxidation of the AlN film alternately, thereby forming an AlON film having a laminated structure in which oxidized AlN films are laminated.

19. A film forming apparatus comprising:
    a film forming unit configured to form an AlO film; and
    a nitridation unit configured to nitride the AlO film after the AlO film is formed,
    wherein the film forming unit and the nitridation unit repeat the formation of the AlO film and the nitridation of the AlO film, thereby forming an AlON film having a laminated structure in which nitrided AlO films are laminated.

* * * * *